United States Patent
Ikeda et al.

(10) Patent No.: US 9,698,017 B2
(45) Date of Patent: Jul. 4, 2017

(54) MANUFACTURING METHOD OF SEMICONDUCTOR DEVICE

(71) Applicant: Toyota Jidosha Kabushiki Kaisha, Toyota-shi, Aichi-ken (JP)

(72) Inventors: Tomoharu Ikeda, Nisshin (JP); Shinichiro Miyahara, Nagoya (JP); Sachiko Aoi, Nagakute (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/056,543

(22) Filed: Feb. 29, 2016

(65) Prior Publication Data
US 2016/0260608 A1    Sep. 8, 2016

(30) Foreign Application Priority Data

Mar. 3, 2015   (JP) .................. 2015-041260

(51) Int. Cl.
| | | |
|---|---|---|
| H01L 29/16 | (2006.01) | |
| H01L 21/04 | (2006.01) | |
| H01L 21/265 | (2006.01) | |
| H01L 21/324 | (2006.01) | |
| H01L 21/02 | (2006.01) | |
| H01L 21/683 | (2006.01) | |

(52) U.S. Cl.
CPC .... *H01L 21/0475* (2013.01); *H01L 21/02378* (2013.01); *H01L 21/02529* (2013.01); *H01L 21/045* (2013.01); *H01L 21/046* (2013.01); *H01L 21/324* (2013.01); *H01L 21/6835* (2013.01); *H01L 29/1608* (2013.01); *H01L 21/0455* (2013.01); *H01L 2221/6834* (2013.01)

(58) Field of Classification Search
CPC .. H01L 21/0455–21/047; H01L 21/324; H01L 21/0475; H01L 29/1608; H01L 21/045–21/046; H01L 21/02529; H01L 21/02378
See application file for complete search history.

(56) References Cited

U.S. PATENT DOCUMENTS

| | | | | |
|---|---|---|---|---|
| 2012/0028452 A1* | 2/2012 | Suzuki | .................. | H01L 21/046 438/522 |
| 2012/0319125 A1* | 12/2012 | Hori | ........................ | C30B 29/36 257/76 |
| 2015/0333175 A1* | 11/2015 | Kiyosawa | ........... | H01L 29/6606 257/77 |
| 2015/0349115 A1* | 12/2015 | Tega | .................... | H01L 29/7813 257/77 |
| 2017/0011921 A1* | 1/2017 | Shibagaki | ........... | H01L 21/3247 |

FOREIGN PATENT DOCUMENTS

JP    2008-283143 A    11/2008

* cited by examiner

*Primary Examiner* — Marvin Payen
*Assistant Examiner* — Jeremy Joy
(74) *Attorney, Agent, or Firm* — Dinsmore & Shohl LLP

(57) ABSTRACT

A manufacturing method of a semiconductor device is provided by forming a trench in a surface of a SiC substrate, positioning a protective substrate to cover the trench, and annealing the SiC substrate and the protective substrate.

8 Claims, 8 Drawing Sheets

MANUFACTURING METHOD OF SEMICONDUCTOR DEVICE

CROSS-REFERENCE TO RELATED APPLICATION

This application claims priority to Japanese Patent Application No. 2015-041260 filed on Mar. 3, 2015, the entire contents of which are hereby incorporated by reference into the present application.

TECHNICAL FIELD

The technology disclosed herein relates to a manufacturing method of a semiconductor device.

DESCRIPTION OF RELATED ART

Japanese Patent Application Publication No. 2008-283143 discloses a technology to form a protective film that consists of Carbon on a front surface of a SiC substrate, and afterwards anneals the SiC substrate. According to this method, the protective film can suppress sublimation of Si from the front surface of the SiC substrate during annealing.

BRIEF SUMMARY

There may be a case where the SiC substrate, which has had a trench formed in its front surface, thereafter needs annealing. In this case, if a protective film is intended to be formed on the front surface of the SiC substrate, before annealing, for the purpose of preventing sublimation of Si, the protective film cannot appropriately be formed on a side surface of the trench. For example, if the protective film is formed by a plasma CVD method or sputtering, the protective film on the side surface of the trench becomes extremely thin. Furthermore, if the protective film is formed by a thermal CVD method, the protective film on the side surface of the trench becomes sparse. Accordingly, it was not possible to suppress sublimation of Si from the side surface of the trench. The present disclosure therefore provides a technology capable of suppressing sublimation of Si from the side surface of the trench during annealing.

A manufacturing method of a semiconductor device disclosed herein comprises forming a trench in a surface of a SiC substrate, positioning a protective substrate to cover the trench, and annealing the SiC substrate and the protective substrate.

In this manufacturing method, the trench is covered with the protective substrate in the annealing step. Accordingly, if Si sublimes from the side surface of the trench in the annealing step, an atmospheric pressure in the trench increases. The increase in atmospheric pressure in the trench suppresses further sublimation of Si from the side surface of the trench. As such, according to this method, it is possible to anneal the SiC substrate while suppressing sublimation of Si from the side surface of the trench.

DETAILED DESCRIPTION

Figure 1:
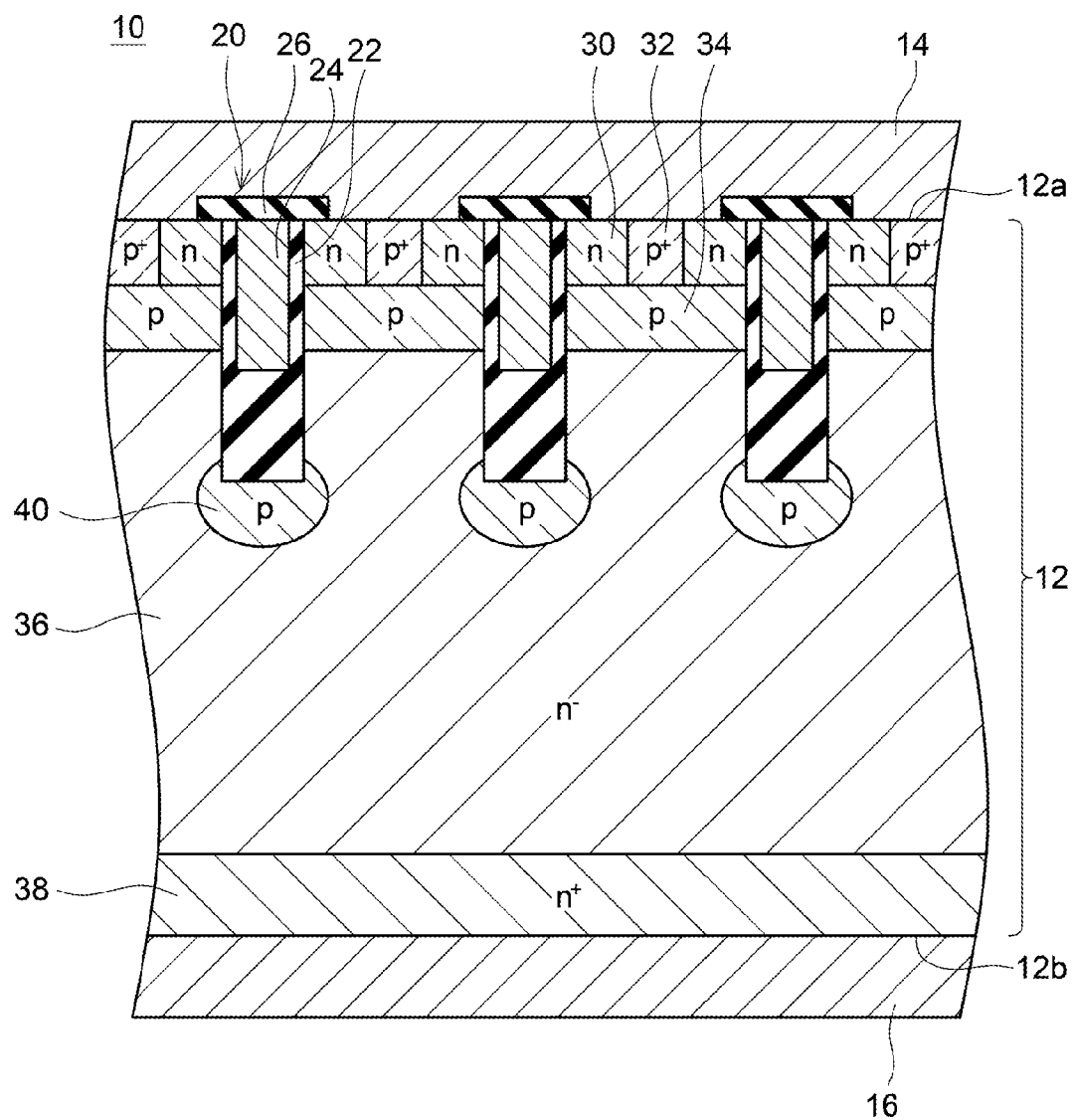
FIG. 1 shows a longitudinal cross section of a MOSFET.

FIG. 1 shows a MOSFET 10 manufactured by a method according to the present embodiment. The MOSFET 10 has a SiC substrate 12. The SiC substrate 12 consists of SiC (silicon carbide). A source electrode 14 is formed on a front surface 12a of the SiC substrate 12. A drain electrode 16 is formed on a back surface 12b of the SiC substrate 12.

A trench 20 is formed in the front surface 12a of the SiC substrate 12. An inner surface of the trench 20 is covered with a gate insulation film 22. The gate insulation film 22 portion that covers a bottom surface of the trench 20 is thicker than the gate insulation film 22 portion that covers a side surface of the trench 20. A gate electrode 24 is positioned inside each trench 20. The gate electrode 24 is insulated from the SiC substrate 12 by the gate insulation film 22. An upper surface of the gate electrode 24 is covered with an interlayer insulation film 26. The gate electrode 24 is insulated from the source electrode 14 by the interlayer insulation film 26.

A source region 30, a body contact region 32, a body region 34, a drift region 36, a drain region 38, and a floating region 40 are formed in the SiC substrate 12. The source region 30 is an n-type region. The source region 30 is formed in a range of the SiC substrate 12 exposed on the front surface 12a. The source region 30 is in ohmic contact with the source electrode 14. The source region 30 is in contact with the gate insulation film 22. The body contact region 32 is a p-type region. The body contact region 32 is formed between two source regions 30. The body contact region 32 is in ohmic contact with the source electrode 14. The body region 34 is a p-type region that has a concentration of p-type impurities lower than that of the body contact region 32. The body region 34 is formed under the source region 30 and the body contact region 32. The body region 34 is in contact with the gate insulation film 22 under the source region 30. The drift region 36 is an n-type region that has a concentration of n-type impurities lower than that of the source region 30. The drift region 36 is formed under the body region 34. The drift region 36 is in contact with the gate insulation film 22 under the body region 34. The drain region 38 is an n-type region that has a concentration of n-type impurities higher than that of the drift region 36. The drain region 38 is formed under the drift region 36. The drain region 38 is formed in a range of the SiC substrate 12 exposed on the back surface 12b. The drain region 38 is in ohmic contact with the drain electrode 16. The floating region 40 is a p-type region. The floating region 40 is in contact with the gate insulation film 22 at a bottom of the trench 20. The periphery of the floating region 40 is surrounded by the drift region 36. When the MOSFET 10 is turned off, the floating region 40 promotes depletion of a part of the drift region 36 located between the trenches 20. Accordingly, the MOSFET 10 has a high withstand voltage.

Figure 2:
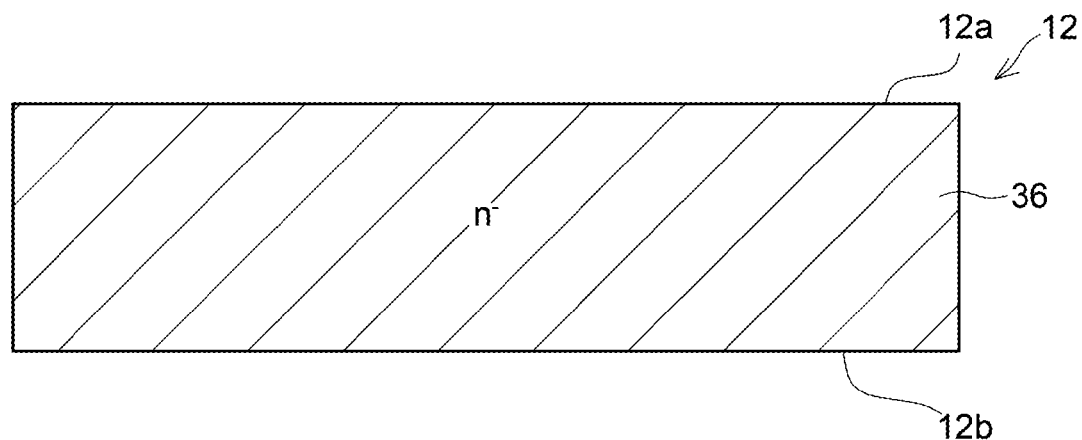
FIG. 2 shows a longitudinal cross section of a SiC substrate before processing.

Next, a manufacturing method of the MOSFET 10 will be described. The MOSFET 10 is manufactured from the SiC substrate 12 obtained before processing, shown in FIG. 2. The SiC substrate 12 obtained before processing, as a whole, is an n-type substrate that has approximately the same concentration of n-type impurities as that of the drift region 36. Furthermore, the SiC substrate 12 has the front surface 12a that is a Si face, and the back surface 12b that is a C face (a Carbon face).

Figure 3:
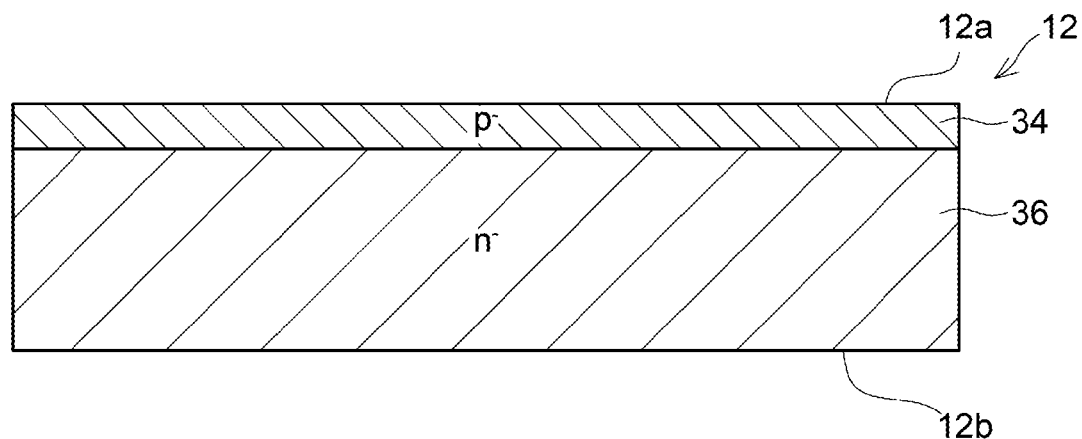
FIG. 3 shows a longitudinal cross section of the SiC substrate in which a body region 34 is formed.

Initially, as shown in FIG. 3, the p-type body region 34 is formed in a range of the SiC substrate 12 on the front surface 12a side. The body region 34 can be formed by ion introduction or epitaxial growth.

Figure 4:
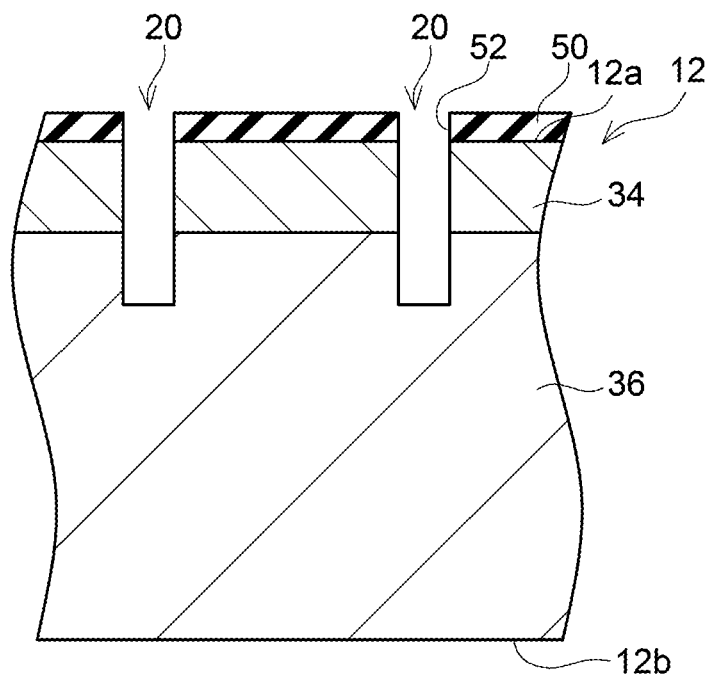
FIG. 4 shows a longitudinal cross section of the SiC substrate in which a trench is formed.

Next, as shown in FIG. 4, an etching mask 50 that has an opening 52 is formed on the front surface 12a of the SiC substrate 12. Next, the SiC substrate 12 in the opening 52 is etched. Each trench 20 is thereby formed in the front surface 12a. Each trench 20 is formed so as to penetrate the body region 34 and reach the drift region 36. When each trench 20 is formed, the etching mask 50 is removed.

Figure 5:
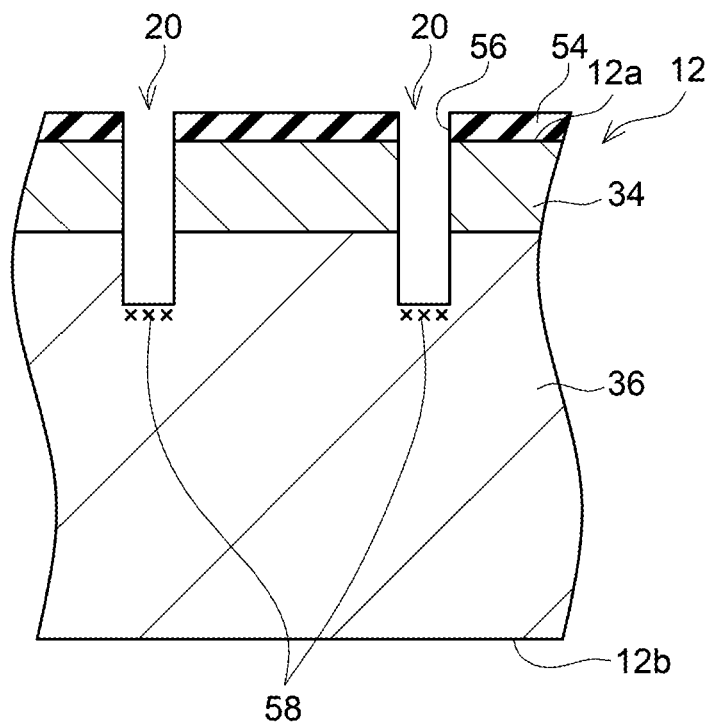
FIG. 5 shows a longitudinal cross section of the SiC substrate after ion introduction to a bottom surface of the trench 20.

Next, as shown in FIG. 5, a mask 54 for ion introduction is formed on the front surface 12a of the SiC substrate 12. The mask 54 has an opening 56 over each trench 20. Next, p-type impurities are introduced to the SiC substrate 12 from the front surface 12a side. The p-type impurities are introduced to the bottom surface of each trench 20 through the opening 56 of the mask 54. Accordingly, an introduced region 58 to which p-type impurities have been introduced is formed in a semiconductor region exposed on the bottom surface of each trench 20. When the ion introduction is completed, the mask 54 is removed.

Figure 6:
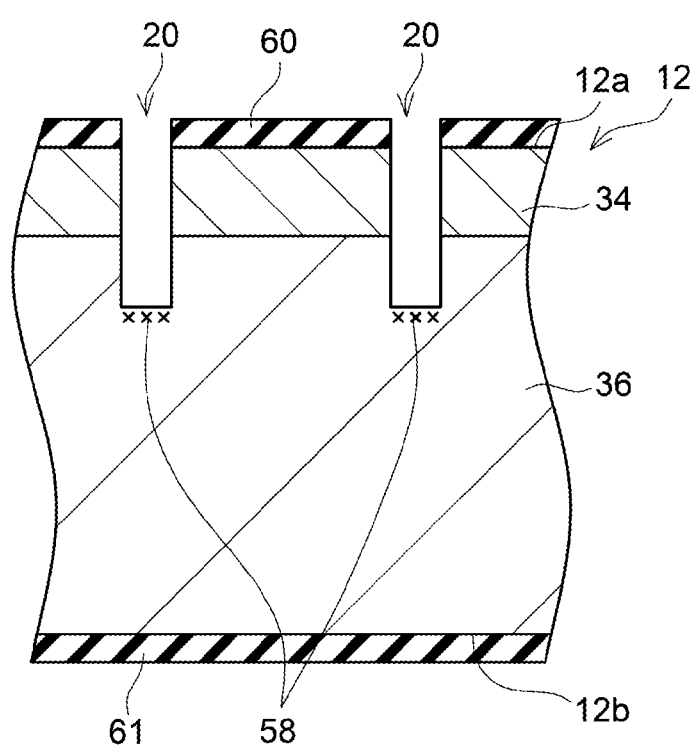
FIG. 6 shows a longitudinal cross section of the SiC substrate after formation of a protective film 60.

Next, as shown in FIG. 6, a protective film 60 is formed on the front surface 12a of the SiC substrate 12. The protective film 60 consists of Carbon. Here, the protective film 60 is formed in entire region of the front surface 12a by sputtering or the like. Note that, although the protective film 60 is also formed on the inner surface of each trench 20, its thickness is extremely small. The protective film 60 inside each trench 20 is therefore not shown. Furthermore, a protective film 61 is similarly formed on the back surface 12b of the SiC substrate 12.

Figure 7:
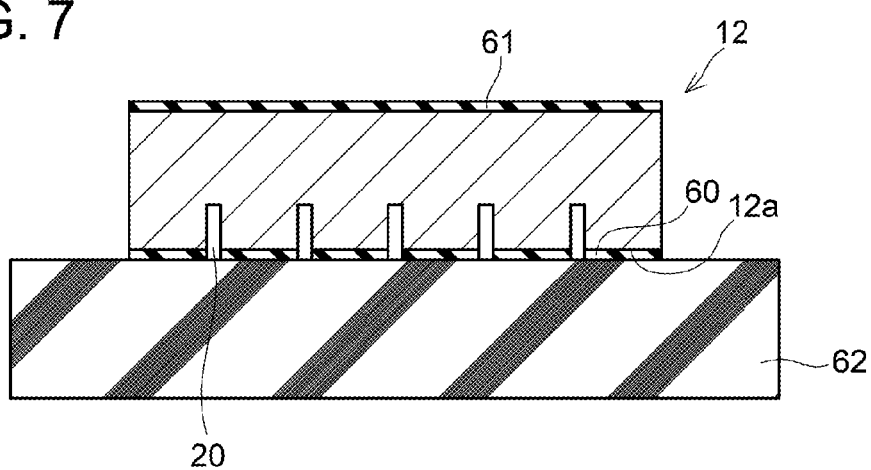
FIG. 7 shows a longitudinal cross section of the SiC substrate mounted on a protective substrate 62.

Next, as shown in FIG. 7, the SiC substrate 12 is mounted on a protective substrate 62. The protective substrate 62 is a plate-like member that has a front surface made of a flat plane. Here, the protective film 60 on the front surface 12a of the SiC substrate 12 is brought into contact with the protective substrate 62. The trenches 20 are thereby covered with the protective substrate 62. In other words, apertures of the trenches 20 are closed by the protective substrate 62. In the present embodiment, the protective substrate 62 consists of SiC. The protective substrate 62 has a melting point equal or higher than 2000 degrees Celsius.

Figure 8:
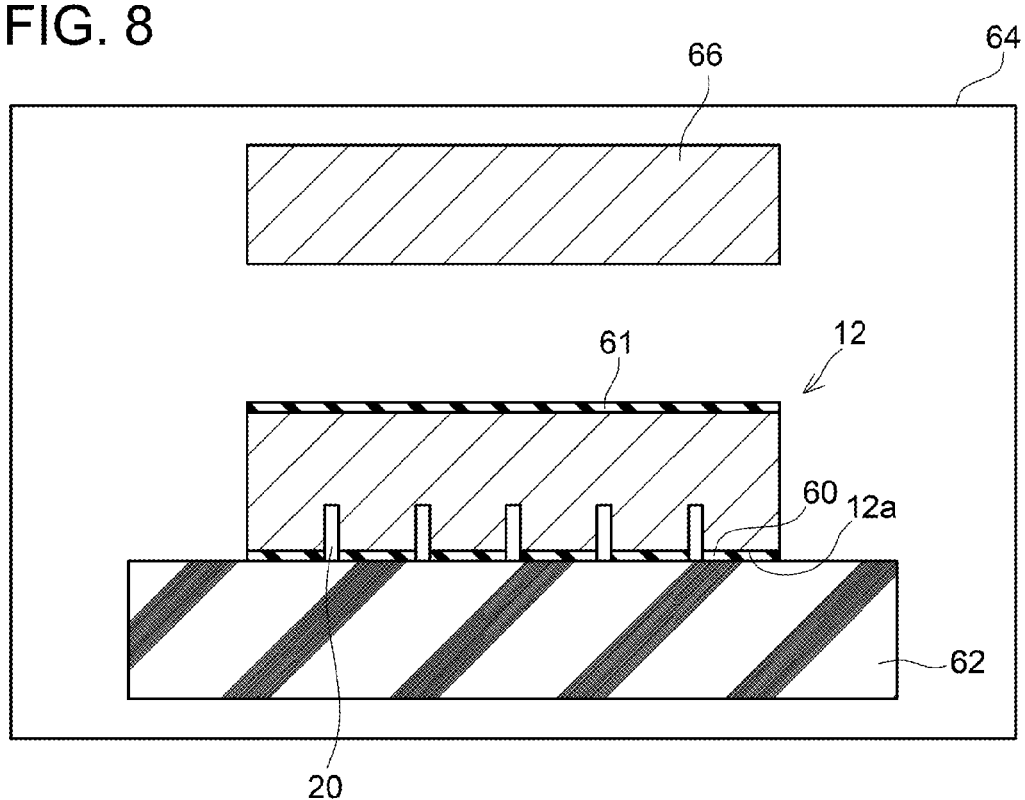
FIG. 8 shows a diagram that shows the SiC substrate installed in a heating furnace 64.

Next, as shown in FIG. 8, the protective substrate 62 and the SiC substrate 12 are set in a heating furnace 64 of a single-wafer type. Here, the SiC substrate 12 is set at a position facing a heater 66. Next, an atmosphere in the heating furnace 64 is substituted with Ar, and the atmospheric pressure in the heating furnace 64 is controlled to about $1 \times 10^4$ Pa. Next, inside of the heating furnace 64 is heated by the heater 66 to thereby anneal the SiC substrate 12 and the protective substrate 62. Here, the SiC substrate 12 and the protective substrate 62 are heated at a temperature equal to or higher than 1700 degrees Celsius and lower than 2000 degrees Celsius.

Figure 9:
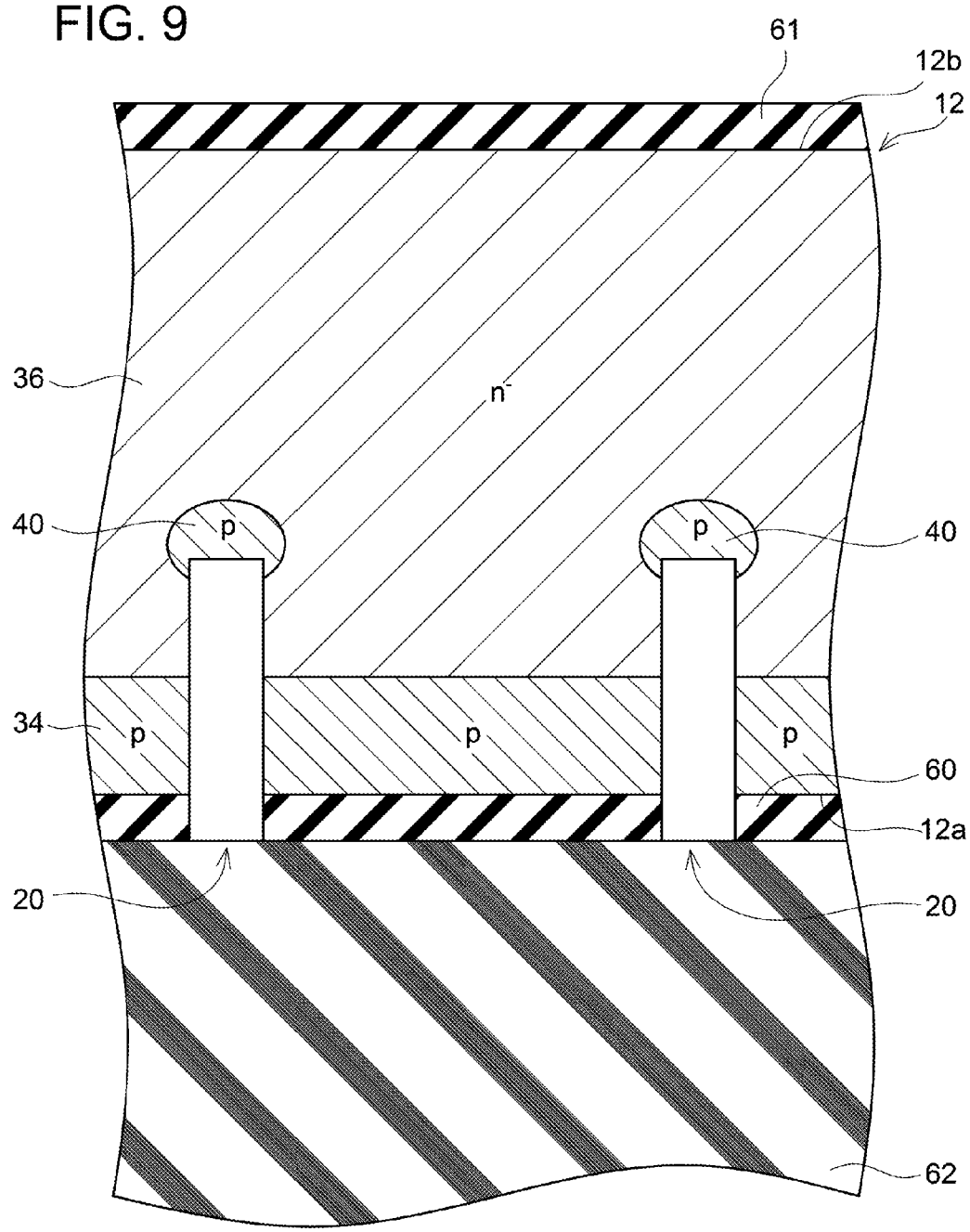
FIG. 9 shows an enlarged cross section of the SiC substrate in FIG. 8.

When the SiC substrate 12 is heated, the p-type impurities introduced to the introduced region 58 in the SiC substrate 12 are activated. The temperature equal to or higher than 1700 degrees Celsius can suitably activate impurities. As shown in FIG. 9, the p-type floating region 40 is therefore formed in a range exposed on the bottom surface of each trench 20.

Furthermore, the protective substrate 62 has heat resistance high enough to withstand the temperature in the annealing step (i.e., has a melting point equal to or higher than 2000 degrees Celsius), and hence is hardly deteriorated in the annealing step.

Furthermore, in the annealing step, Si sublimes from the inner surface (i.e., the side surface and the bottom surface) of each trench 20 in the SiC substrate 12. The apertures of the trenches 20 are closed by the protective substrate 62, and hence when Si in the inner surface of each trench 20 sublimes, the atmospheric pressure inside each trench 20 is increased within a short time. Note that the SiC substrate 12 and the protective substrate 62 are not joined, and the SiC substrate 12 is placed on the protective substrate 62 under its own weight. A minute gap therefore exists between the protective film 60 and the protective substrate 62. A part of the Si gas generated inside the trenches 20 passes through the gap and leaks from the trenches 20. However, since the gap is small, the amount of leaked Si gas is small. Accordingly, the generation of the Si gas causes an increase in atmospheric pressure inside the trenches 20. The atmospheric pressure inside the trenches 20 becomes higher than the atmospheric pressure outside the trenches 20 in the heating furnace 64. In the present embodiment, the atmospheric pressure outside the trenches 20 in the heating furnace 64 is about $1 \times 10^4$ Pa, and hence the atmospheric pressure inside the trenches 20 becomes equal to or higher than $1 \times 10^4$ Pa. As such, when the atmospheric pressure inside the trenches 20 becomes high, Si is difficult to sublime from the inner surface of each trench 20. Accordingly, sublimation of Si from the inner surface of the trenches 20 is suppressed. Particularly inside the trenches 20, sublimation of Si causes an increase in concentration of the Si gas (i.e., an increase in partial pressure). Accordingly, sublimation of Si from the inner surface of each trench 20 is further suppressed.

Furthermore, the front surface 12a of the SiC substrate 12 is covered with the protective film 60, which suppresses sublimation of Si from the front surface 12a of the SiC substrate 12. Furthermore, the front surface 12a of the SiC substrate 12 is also covered with the protective substrate 62, which also suppresses sublimation of Si from the front surface 12a of the SiC substrate 12. Furthermore, the back surface 12b of the SiC substrate 12 is covered with the protective film 61, which suppresses sublimation of Si from the back surface 12b.

Note that, in the annealing step, the protective film 60 on the front surface 12a of the SiC substrate 12 is brought into contact with the protective substrate 62, and hence there may be a case where foreign substances attach to a front surface of the protective film 60. The protective film 60 prevents foreign substances from attaching directly to the front surface 12a of the SiC substrate 12.

When the annealing step is completed, the protective film 60 is then removed by etching. The front surface 12a of the SiC substrate 12 is thereby exposed. In removing the protective film 60, foreign substances that attach to the front surface of the protective film 60 are also removed. Accordingly, the front surface 12a can be prevented from being contaminated. Furthermore, the protective film 61 is also removed along with the protective film 60.

When the protective film 60 is removed, the gate insulation film 22 and the gate electrode 24 are formed inside each trench 20. Next, p-type impurities and n-type impurities are selectively introduced to the front surface 12a of the SiC substrate 12, to thereby form the source region 30 and the body contact region 32. Afterwards, the interlayer insulation film 26 and the source electrode 14 are formed on the front surface 12a of the SiC substrate 12, to thereby complete the structure of the MOSFET 10 on the front surface 12a side.

Next, processing of the SiC substrate 12 on the back surface 12b side (i.e., formation of the drain region 38 and the drain electrode 16) is performed. Through the above-described process, the MOSFET 10 shown in FIG. 1 is completed.

As described above, according to this method, since the apertures of the trenches 20 are closed by the protective substrate 62, the atmospheric pressure inside the trenches 20 becomes higher than the atmospheric pressure outside the trenches 20 in the annealing step. Accordingly, sublimation of Si from the inner surface of each trench 20 can be suppressed.

Note that, if sublimation of Si from the inner surface of each trench 20 is not suppressed, a carbon-rich layer (a layer in which C concentration is higher than Si concentration) is formed on the inner surface of each trench 20. In a case where a gate structure is formed with the use of such trenches 20, and when the MOSFET 10 is turned on and electrons flow along a channel (i.e., along the side surface of each trench 20), the electrons are trapped in the carbon-rich layer. Accordingly, the channel resistance is increased and a power loss caused in the MOSFET 10 is increased. Furthermore, in the case where the carbon-rich layer is formed on the inner surface of each trench 20, the inner surface of each trench 20 becomes rough. The roughness of the inner surface of each trench 20 also increases the channel resistance and increases the power loss caused in the MOSFET 10. In contrast, in the manufacturing method according to the present embodiment, suppressing sublimation of Si suppresses the formation of a carbon-rich layer on the inner surface of each trench 20 and the roughness of the inner surface of each trench 20. Accordingly, the channel resistance of the MOSFET 10 can be decreased. According to the manufacturing method in the present embodiment, the MOSFET 10 with a low power loss can therefore be manufactured.

Furthermore, in the manufacturing method according to the present embodiment, the protective substrate 62 having a melting point equal to or higher than 2000 degrees Celsius is used. If such a protective substrate 62 is used, the protective substrate 62 is not deteriorated and remains stable even in the annealing step at a high temperature (equal to or higher than 1700 degrees Celsius) at which the impurities introduced to the SiC substrate 12 are activated. Accordingly, sublimation of Si from the inner surface of each trench 20 can effectively be suppressed. Furthermore, the SiC substrate 12 can be prevented from being contaminated by the protective substrate 62. As a material of the protective substrate 62, a simple substance of Carbon (e.g., graphite or the like) or a Carbon compound (e.g., SiC, TaC, or the like) can be adopted. Furthermore, a highly heat-resistant material that contains no Carbon, such as BN (boron nitride) or the like, may also be adopted as the material of the protective substrate 62. Furthermore, a material having heat resistance similar to that of the protective substrate 62 can be adopted as a material of the protective film 60.

Furthermore, in one experiment the atmospheric pressure required for suppressing sublimation of SiC was measured by annealing the SiC substrate 12 without the trenches 20 being closed and varying the setting of atmospheric pressure in the furnace. Consequently, it was revealed that when the atmospheric pressure in the furnace became equal to or higher than $1 \times 10^4$ Pa, a significant effect of suppressing sublimation of Si from the inner surface of each trench 20 (i.e., a significant effect of making difficult the formation of a carbon-rich layer) was obtained. In the manufacturing method of the semiconductor device according to the present embodiment, the annealing is performed by setting the atmospheric pressure of Ar in the furnace (outside the trenches 20) to about $1 \times 10^4$ Pa. The atmospheric pressure inside the trenches 20 becomes higher than the atmospheric pressure outside the trenches 20, and hence according to this method, the atmospheric pressure inside the trenches 20 can surely be controlled to be equal to or higher than $1 \times 10^4$ Pa. Accordingly, sublimation of Si from the inner surface of each trench 20 can be suppressed. Note that, in another embodiment, the annealing step may be performed such that the atmospheric pressure inside the trenches 20 is equal to or higher than $1 \times 10^4$ Pa, and the atmospheric pressure outside the trenches 20 is made lower than $1 \times 10^4$ Pa.

Figure 10:
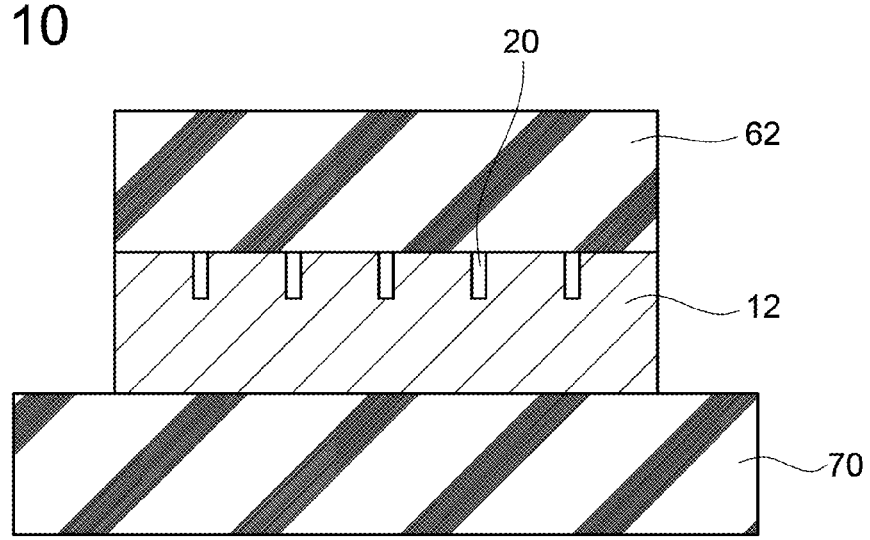
FIG. 10 shows an illustration of a manner in which the protective substrate is mounted on the SiC substrate.

Furthermore, in the manufacturing method according to the present embodiment, the SiC substrate 12 is mounted on the protective substrate 62 to thereby close the apertures of the trenches 20. According to this method, the protective substrate 62 can be used as a carrying plate for carrying the SiC substrate 12. Accordingly, the number of members used in the manufacturing process can be reduced. Note that, as shown in FIG. 10, a carrying plate 70 for carrying the SiC substrate 12 can also be prepared separately. In this case, the trenches 20 may be covered by mounting the SiC substrate 12 on the carrying plate 70 such that the SiC substrate 12 is oriented upwardly (in an orientation that allows the trenches 20 to be oriented upwardly), and mounting the protective substrate 62 on the SiC substrate 12.

Figure 11:
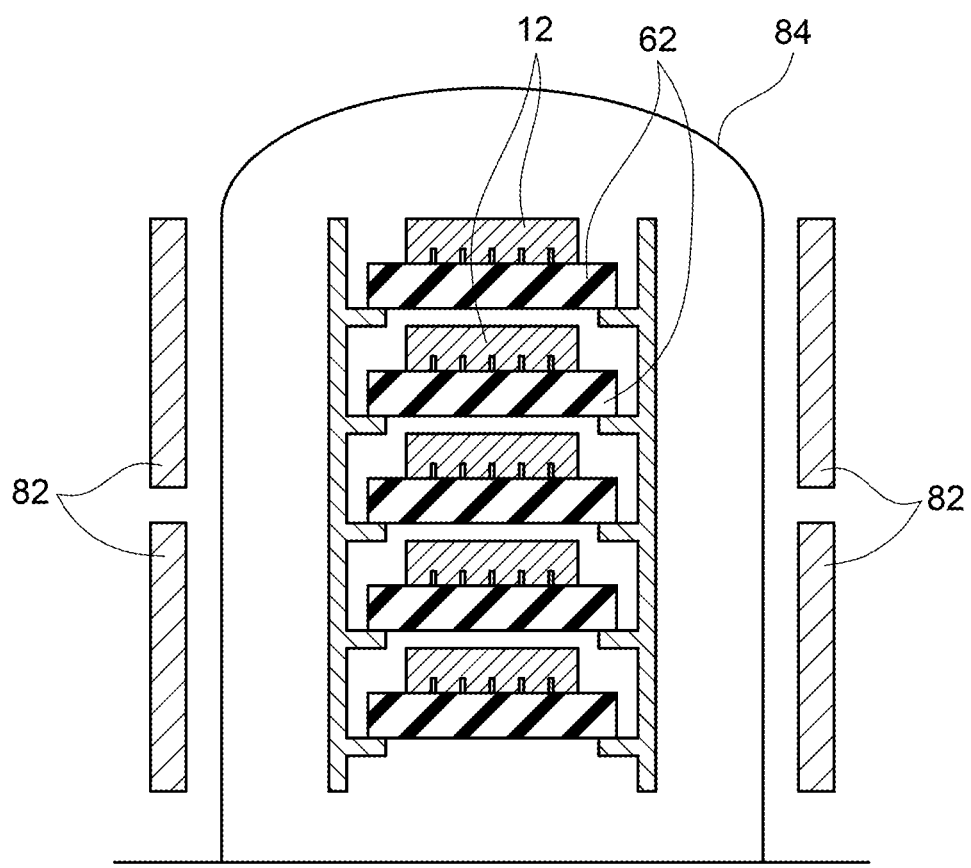
FIG. 11 shows an illustration of a heating furnace of a batch-processing type.

Furthermore, in the manufacturing method according to the present embodiment, the heating furnace 64 of a single-wafer type, as shown in FIG. 8, is used. However, as shown in FIG. 11, a heating furnace 84 of a batch type can anneal all of a plurality of SiC substrates 12 at a time by heaters 82.

Furthermore, in the above-described embodiment, the manufacturing method of the MOSFET 10 has been described. However, other semiconductor devices having a trench (e.g., other switching devices, diodes, or the like having a trench structure) may also be manufactured.

Furthermore, in the above-described embodiment, the protective film 61 is formed on the back surface 12b of the SiC substrate 12. However, if a carbon-rich layer is allowed to be formed on the back surface 12b during the annealing (e.g., if a carbon-rich layer is removed after the annealing), the protective film 61 may not be formed.

Some of the technical features herein disclosed are summarized below. Note that matters described below independently have technical utilities.

In one aspect herein disclosed, a manufacturing method of a semiconductor device may comprise forming a trench in a surface of a SiC substrate, positioning a protective substrate to cover the trench, and annealing the SiC substrate and the protective substrate.

In one aspect herein disclosed, a melting point of the protective substrate may be equal to or higher than 2000 degrees Celsius. In the annealing of the SiC substrate and the protective substrate, the SiC substrate may be annealed at a temperature equal to or higher than 1700 degrees Celsius.

According to this aspect, the protective substrate has sufficient heat resistance relative to the temperature in the annealing step, and deterioration of the protective substrate in the annealing step can be suppressed.

In one aspect herein disclosed, the method may further comprise forming a protective film on the surface of the SiC substrate after the forming of the trench, and removing the protective film after the annealing of the SiC substrate and the protective substrate. In the positioning of the protective substrate, the protective substrate may be positioned on the surface side of the SiC substrate on which the protective film has been formed.

When the SiC substrate and the protective substrate directly come in contact with each other, there may be a case where foreign substances attach to the front surface of the SiC substrate. In contrast, according to this configuration, the protective substrate comes in contact with the front surface of the protective film, and hence foreign substances attach instead to the protective film. Afterwards, by removing the protective film, the foreign substances can be removed from the front surface of the SiC substrate, along with the protective film.

In one aspect herein disclosed, the method may further comprise introducing impurities to the SiC substrate before the annealing of the SiC substrate and the protective substrate.

According to this aspect, the impurities can be activated in the annealing.

In one aspect herein disclosed, the SiC substrate may be mounted on the protective substrate in the positioning of the protective substrate.

According to this aspect, the SiC substrate can be carried by the protective substrate.

In one aspect herein disclosed, the protective substrate may consist of Carbon or a compound including Carbon.

According to this aspect, the protective substrate can be ensured to have high heat resistance.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A manufacturing method of a semiconductor device, the method comprising:

forming a trench in a surface of a SiC substrate;
    positioning a protective substrate to cover the trench; and
    annealing the SiC substrate and the protective substrate in a heating furnace,
    in the annealing of the SiC substrate and the protective substrate the annealing is performed such that an atmospheric pressure inside the trench becomes higher than an atmospheric pressure outside the trench in the heating furnace.

2. The manufacturing method according to claim 1, wherein
    a melting point of the protective substrate is equal to or higher than 2000 degrees Celsius, and
    in the annealing of the SiC substrate and the protective substrate, the SiC substrate is annealed at a temperature equal to or higher than 1700 degrees Celsius.

3. The manufacturing method according to claim 1, the method further comprising:
    forming a protective film on the surface of the SiC substrate after the forming of the trench; and
    removing the protective film after the annealing of the SiC substrate and the protective substrate,
    wherein
    in the positioning of the protective substrate, the protective substrate is positioned on the surface side of the SiC substrate on which the protective film has been formed.

4. The manufacturing method according to claim 1, the method further comprising:
    introducing impurities to the SiC substrate before the annealing of the SiC substrate and the protective substrate.

5. The manufacturing method according to claim 1, wherein
    in the positioning of the protective substrate, the SiC substrate is mounted on the protective substrate.

6. The manufacturing method according to claim 1, wherein
    the protective substrate consists of Carbon or a compound including Carbon.

7. The manufacturing method according to claim 1, further comprising:
    carrying the SiC substrate with the protective substrate into the heating furnace before annealing the SiC substrate and the protective substrate such that the protective substrate is used as a carrying plate for carrying the SiC substrate.

8. The manufacturing method according to claim 1, wherein in the positioning of the protective substrate the protective substrate is directly positioned onto the surface of the SiC substrate.

* * * * *